US011721317B2

(12) United States Patent
Reiss et al.

(10) Patent No.: US 11,721,317 B2
(45) Date of Patent: Aug. 8, 2023

(54) SOUND EFFECT SYNTHESIS

(71) Applicant: QUEEN MARY UNIVERSITY OF LONDON, London (GB)

(72) Inventors: Joshua Reiss, London (GB); Thomas Vassallo, London (GB); Adan Benito, London (GB); Parham Bahadoran, London (GB)

(73) Assignee: QUEEN MARY UNIVERSITY OF LONDON, London (GB)

( * ) Notice: Subject to any disclaimer, the term of this patent is extended or adjusted under 35 U.S.C. 154(b) by 0 days.

(21) Appl. No.: 16/960,048

(22) PCT Filed: Nov. 29, 2018

(86) PCT No.: PCT/GB2018/053459
§ 371 (c)(1),
(2) Date: Jul. 3, 2020

(87) PCT Pub. No.: WO2019/106372
PCT Pub. Date: Jun. 6, 2019

(65) Prior Publication Data
US 2021/0082391 A1  Mar. 18, 2021

(30) Foreign Application Priority Data
Nov. 29, 2017 (GB) .................................. 1719854

(51) Int. Cl.
*G10K 15/02*   (2006.01)
*G06F 3/16*   (2006.01)
(Continued)

(52) U.S. Cl.
CPC ............ *G10K 15/02* (2013.01); *G06F 3/165* (2013.01); *A63F 9/24* (2013.01); *A63F 13/54* (2014.09);
(Continued)

(58) Field of Classification Search
CPC . H03G 3/00; G09B 15/04; G10H 5/02; G10H 2250/321; G10H 2250/371;
(Continued)

(56) References Cited

U.S. PATENT DOCUMENTS 5,331,111 A * 7/1994 O'Connell ............. G09B 15/04
84/477 R
5,926,400 A * 7/1999 Kytle ....................... G06F 3/011
703/13

(Continued)

FOREIGN PATENT DOCUMENTS

EP          2468371 A1    6/2012
WO    WO-9916049 A1 *    4/1999   ............. G10H 7/004
WO    WO-2010147580 A2   12/2010

OTHER PUBLICATIONS

Luna, User Documentation (Year: 2004).*
(Continued)

*Primary Examiner* — Matthew A Eason
*Assistant Examiner* — Kuassi A Ganmavo
(74) *Attorney, Agent, or Firm* — Harness, Dickey & Pierce, P.L.C.

(57) ABSTRACT

Disclosed herein is a sound synthesis system for generating a user defined synthesised sound effect, the system comprising: a receiver of user defined inputs for defining a sound effect; a generator of control parameters in dependence on the received user defined inputs; a plurality of sound effect objects, wherein each sound effect object is arranged to generate a different class of sound and each sound effect object comprises a sound synthesis model arranged to generate a sound in dependence on one or more of the control parameters; a plurality of audio effect objects, wherein each audio effect object is arranged to receive a sound from one or more sound effect objects and/or one or more other audio effect objects, process the received sound in dependence on
(Continued)

one or more of the control parameters and output the processed sound; a scene creation function arranged to receive sound output from one or more sound effect objects and/or audio effect objects and to generate a synthesised sound effect in dependence on the received sound; and an audio routing function arranged to determine the arrangement of audio effect objects, sound effect objects and scene creation function such that one or more sounds received by the scene creation function are dependent on the audio routing function; wherein the determined arrangement of audio effect objects, sound effect objects and the scene creation function by the audio routing function is dependent on the user defined inputs.

19 Claims, 5 Drawing Sheets

(51) Int. Cl.

| | | |
|---|---|---|
| H03G 3/00 | (2006.01) | |
| G09B 15/04 | (2006.01) | |
| G10H 1/00 | (2006.01) | |
| G10L 13/08 | (2013.01) | |
| G06F 3/01 | (2006.01) | |
| G10H 5/02 | (2006.01) | |
| A63F 13/54 | (2014.01) | |
| G11B 27/034 | (2006.01) | |
| A63F 9/24 | (2006.01) | |

(52) U.S. Cl.
CPC ............... *G06F 3/01* (2013.01); *G09B 15/04* (2013.01); *G10H 1/0025* (2013.01); *G10H 5/02* (2013.01); *G10H 2210/125* (2013.01); *G10H 2220/096* (2013.01); *G10H 2250/321* (2013.01); *G10H 2250/371* (2013.01); *G10H 2250/395* (2013.01); *G10L 13/08* (2013.01); *G11B 27/034* (2013.01); *H03G 3/00* (2013.01)

(58) Field of Classification Search
CPC ........... G10H 1/0025; G10H 2210/125; G10H 2220/096; G10K 15/02; G06F 3/165; G06F 3/01; G10L 13/08; A63F 13/54; A63F 9/24; G11B 27/034
See application file for complete search history.

(56) References Cited

U.S. PATENT DOCUMENTS

| | | | | |
|---|---|---|---|---|
| 2005/0105442 | A1* | 5/2005 | Melchior | G10L 19/008 369/83 |
| 2007/0112977 | A1* | 5/2007 | Hornal | H04W 8/245 709/246 |
| 2008/0074775 | A1* | 3/2008 | Reichelt | G11B 27/28 |
| 2008/0181438 | A1* | 7/2008 | Beckinger | H04S 3/00 381/300 |
| 2009/0048698 | A1* | 2/2009 | Fay | H04S 1/007 700/94 |
| 2010/0004766 | A1* | 1/2010 | Feng | G10H 1/46 700/94 |
| 2010/0049346 | A1* | 2/2010 | Boustead | A63F 13/12 700/94 |
| 2012/0263310 | A1* | 10/2012 | Fournel | A63F 13/54 381/61 |
| 2012/0272069 | A1* | 10/2012 | Ireland | A63H 19/24 713/189 |
| 2013/0170650 | A1* | 7/2013 | Fujisawa | H04S 3/008 381/19 |
| 2013/0301839 | A1* | 11/2013 | Vogel | G10H 1/08 381/61 |
| 2014/0334630 | A1* | 11/2014 | Harel | G10H 1/368 381/61 |
| 2015/0042662 | A1* | 2/2015 | Latorre-Martinez | G10L 21/10 345/473 |
| 2016/0317929 | A1* | 11/2016 | Wu | A63F 13/54 |
| 2018/0359591 | A1* | 12/2018 | Bygrave | H04S 3/008 |

OTHER PUBLICATIONS

Baldan, The Sound Design Toolkit (Year: 2017).*
Wyse, A Sound Modeling and Syntheis System Designed for Maximum Usability (Year: 2003).*
Meinart, Subsynth: A generic Audio Syntheis framework for real time applications (Year: 2002).*
Bencina, Ross, et al., "AudioMulch Help v. 2.2.4", AudioMulch homepage, Jan. 1, 2013 (Jan. 1, 2013), XP055560368, Retrieved from the Internet: URL:http://downloads.audiomulch.com/AudioMulch_Help.pdf [retrieved on Feb. 21, 2019].
International Search Report and Written Opinion of the International Searching Authority issued in PCT/GB2018/053459, dated Mar. 1, 2019; ISA/EP.
Search Report regarding Application No. GB1719854.0 dated May 30, 2018.

* cited by examiner

SOUND EFFECT SYNTHESIS

CROSS REFERENCE TO RELATED APPLICATIONS

This application is a U.S. National Phase Application under 35 U.S.C. 371 of International Application No. PCT/GB2018/053459 filed on Nov. 29, 2018, which claims the benefit of priority from Great Britain Patent Application No. 1719854.0 filed Nov. 29, 2017. The entire disclosures of all of the above applications are incorporated herein by reference.

FIELD

The field of the invention is the synthesis of sounds. Embodiments provide a modular approach to sound synthesis that allows sound effects to be created and modified from modular components. Advantageously, sound effect libraries comprising pre-recorded components are not required.

BACKGROUND

Sound effects have a number of applications in creative industries. There are libraries of sound effects that store pre-recorded samples of sounds. A problem experienced by the libraries is that it is necessary for each library to store a very large number of pre-recorded samples in order for a broad range of sound effects to be generated.

There is therefore a need to improve the provision of sound effects.

SUMMARY

According to a first aspect of the invention, there is provided a sound synthesis system for generating a user defined synthesised sound effect, the system comprising: a receiver of user defined inputs for defining a sound effect; a generator of control parameters in dependence on the received user defined inputs; a plurality of sound effect objects, wherein each sound effect object is arranged to generate a different class of sound and each sound effect object comprises a sound synthesis model arranged to generate a sound in dependence on one or more of the control parameters; a plurality of audio effect objects, wherein each audio effect object is arranged to receive a sound from one or more sound effect objects and/or one or more other audio effect objects, process the received sound in dependence on one or more of the control parameters and output the processed sound; a scene creation function arranged to receive sound output from one or more sound effect objects and/or audio effect objects and to generate a synthesised sound effect in dependence on the received sound; and an audio routing function arranged to determine the arrangement of audio effect objects, sound effect objects and scene creation function such that one or more sounds received by the scene creation function are dependent on the audio routing function; wherein the determined arrangement of audio effect objects, sound effect objects and the scene creation function by the audio routing function is dependent on the user defined inputs.

Preferably, the sound synthesis system further comprises an application interface, API, wherein: the user defined inputs are input to the sound synthesis system via the API; and the generated synthesised user defined sound effect is output from the sound synthesis system via the API.

Preferably, the user defined inputs are received via the Internet.

Preferably, each sound synthesis model comprises an algorithm configured to generate a synthesised sound in dependence on one or more of the control parameters.

Preferably, each of the sound synthesis models comprises a plugin.

Preferably, each of the audio effect object comprises an algorithm configured to process a received sound in dependence on one or more of the control parameters.

Preferably, each of the audio effect objects comprises a plugin.

Preferably, the sound synthesis system is arranged to operate substantially in real time.

Preferably, the sound effect object comprises a spatialisation function for generating sound effects directed towards a position in a virtual space.

Preferably, for each sound generated by one or more of the sound effect objects, the audio routing function is arranged to determine the order in which a plurality of the audio effect objects process the sound; and/or the audio routing function is arranged to determine the number of sound effect objects that each sound received by the scene creation function is generated in dependence on.

Preferably, a plurality of the audio effect objects are arranged in series with other so that a sound is sequentially processed by each of the audio effect objects.

Preferably, a plurality of the audio effect objects are arranged in parallel with other so that the parallel audio effect objects receive and process the same sound.

Preferably, the audio routing function comprises: one or more synthesis tracks that comprise one or more audio effect objects in series with a sound effect object; and, optionally one or more auxiliary channels, wherein each auxiliary channel is split from a synthesis track and comprises one or more audio effect objects; and/or one or more mix busses for combining received sounds from one or more synthesis tracks and/or one or more auxiliary channels.

Preferably, each synthesis track, auxiliary channel and mix bus comprises gain and panning controls.

Preferably, the scene creation function generates the synthesised sound effect in dependence time data for each of the sound effect objects.

Preferably, the sound synthesis system further comprises one or more timelines, wherein the time data for each of the sound effect objects is determined in dependence on the one or more timelines.

Preferably, a timeline is defined for each synthesis track, auxiliary channel and mix bus.

Preferably, the sound synthesis system further comprises a trigger track for defining start times and or end times on the timeline of each sound effect object and/or audio effect object.

Preferably, the trigger track further comprises a randomiser arranged to cause random, or pseudo-random, variations of a sound.

Preferably, a trigger track is provided for one or more synthesis track, auxiliary channel, sound effect, mix bus, sound effect object and audio effect object.

Preferably, the sound synthesis system further comprises a control track for changing one or more of the control parameters over the timeline.

Preferably, a control track is provided for one or more synthesis track, auxiliary channel, sound effect, mix bus, sound effect object and audio effect object.

Preferably, the sound synthesis system further comprises a graphical user interface for receiving inputs user defined inputs.

Preferably, at least some of the sound effect objects and/or audio effect objects comprise graphical user interface elements; and the graphical user interface is arranged to be automatically generated in dependence on the graphical user interface elements; wherein the graphical user interface elements are dependent on one or more of the controllable parameters of the sound effect objects and/or audio effect objects.

Preferably, the graphical user interface displays one or more timelines that display properties of one or more sound effect objects and/or audio effect objects; and the user defined inputs are generated by a user modifying the displayed properties on the timeline.

Preferably, the control parameters comprise global parameters that are the same for each sound effect object and audio effect object in a synthesis track and/or auxiliary channel for a sound effect.

Preferably, the control parameters comprise object specific parameters that are the same or different for each sound effect object and audio effect object in a synthesis track and/or auxiliary channel for a sound effect.

Preferably, the user defined inputs are user intuitive inputs; and the generator of the control parameters is arranged to map the user defined inputs to the control parameters.

Preferably, the user defined inputs include real-world characteristics of a sound effect and/or semantic descriptors, such as any of density of rain, crackling of fire, wind speed, height, bubble frequency, duration, distance from listener, roughness of ground, warmth, depth, woosh, rumble, ambience, gustiness and sounds like metal/plastic/cardboard.

Preferably, the sound synthesis system is computer-implemented.

Preferably, the sound effect object, audio effect object and scene creation function are all software modules.

Preferably, the number of different classes of sound that can be generated by sound effect objects is 100.

Preferably, the classes of sound include nature, animals, weapons, alarms/ringing, impacts and machinery.

According to a second aspect of the invention, there is provided a method of synthesising a user defined synthesised sound effect, the method comprising: inputting a definition of a sound effect into a sound synthesis system according to the first aspect and receiving a sound effect from the sound synthesis system.

According to a third aspect of the invention, there is provided a computer program comprising instructions that, when executed, provide a sound synthesis system according to the first aspect.

LIST OF FIGURES

DESCRIPTION

Figure 1:
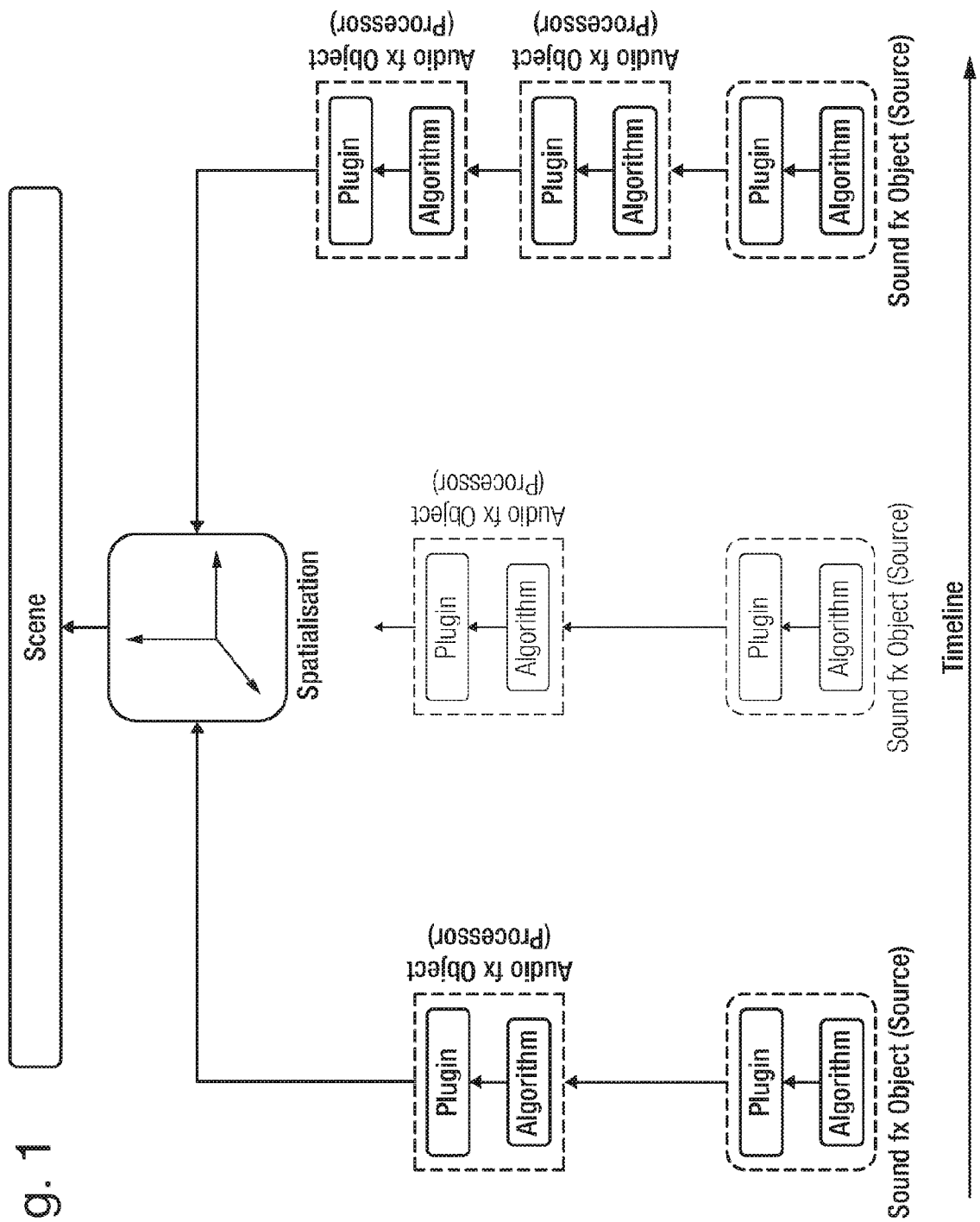
FIG. 1 shows an arrangement of modules in a sound synthesis system according to an embodiment.

Embodiments of the invention provide a sound synthesis system whereby sound effects can be easily generated and modified. Advantageously, embodiments avoid a problem with known techniques as a broad range of sound effects can be generated without any pre-recorded samples being required.

According to embodiments, sound synthesis models are used to generate sound effects instead of the known techniques based on large sound effect libraries. The use of sound synthesis models improves the control that sound designers have over sound effects.

Advantages of embodiments over known techniques include:

Sound synthesis can produce a whole range of sounds (e.g., walking/running at any arbitrary speed, a bouncing ball dropped from any height), whereas a sound effects library can only render a finite number of predetermined example sounds.

The synthesised sounds can play for any amount of time, whereas the sound samples are of fixed duration.

The sound synthesis has perceptually relevant and intuitive controls (e.g., the roughness of the ground against a rolling object, the crackling of embers in a fire), whereas samples need to be processed by additional tools that were not designed for that task (e.g., adding distortion and random noise to approximate roughness).

Various sound synthesis tools can be easily integrated to devise soundscape synthesis tools (e.g., thunder, wind and rain in storm synthesis), ensuring that synthesized sounds can be easily generated and customised for use.

There is no need for the complicated storage, retrieval and annotation systems associated with large commercial sound effect libraries.

Embodiments provide an integrated framework comprising:

1. Modular components for the generation of low level sound signals.
2. A small number of real-time sound synthesis models, using the modular components described in step 1, each one focused on a class of sounds.
3. Intuitive interfaces that expose relevant parameters for control of sound class characteristics.
4. Shared modular components for manipulating the generated sounds and their controls, including triggering and randomization mechanisms.

Provided below is a global description of the sound synthesis techniques according to embodiments.

Framework

Provided below is a description of the framework of the sound synthesis system according to embodiments.

The proposed platform is an online real-time sound effect synthesis service powered by a database of bespoke synthesis models. These synthesis models are based on fine-tuned algorithms, specially developed for the generation of a large spectrum of sound effects.

The algorithms, are not restricted, but typically involve the manipulation, processing and combining of noise sources, impulses and oscillators to capture relevant characteristics of sound effects, e.g., adding tones to produce touch tone telephone sounds, filtering noise sources to capture the background ambience of rain. Elements of the algorithms may be shared and re-used by the different synthesis models. The synthesis models are developed with the sound design process kept in mind, and are therefore equipped with meaningful exposed control parameters which drive the algorithms underlying each model. The sound generation process is carried out in real-time through the employment of the Web Audio API.

This database of sound effect synthesis models can be combined with a number of post-processing tools which includes audio effects and spatial placement tools via a chaining mechanism to further tailor the sound to the needs of the user.

A collection of sound effect synthesis models along with post-processing tools can also be arranged across a timeline to allow triggering, manipulation of their behaviour and shaping them over time to generate a more complex sound scene.

Definitions

Provided below are the definition of components of the sound synthesis system according to embodiments.

Plugin—An audio plugin is a piece of software designed to integrate an audio algorithm (whether it is for analysis, synthesis or processing) into a host (in this case, the browser). The audio plugin handles the different routines for parameter control and exposes them to the user interface. Different plugin instances can be created, destroyed and chained to create an audio graph. The plugin is also in charge of managing the input and output connections between instances and loading or unloading the resources required by the process.

Sound synthesis model—A sound synthesis model defines a mathematical algorithm designed with the sole aim of generating a specific sound and all the different interactions with the control parameters that control the different qualities of that sound. Each sound synthesis model is provided with one or more preset values for its control parameters. The preset values are default values of user definable control parameters that are used if values for any of the control parameters are not received.

Sound Effect Object—A sound effect object, also referred to as a sound fx object, can be identified as a generator of a sound. It is comprised of the following elements: the algorithm for generating the sound, the different parameters that are to be controlled by the user, the plugin wrapper and any other functions or resources required by it. The algorithm for generating the sound is a sound synthesis model.

Audio Effect Object—An audio effect object, also referred to as an audio fx object, defines an audio processor element used to manipulate and modify a sound. The object is comprised of the following elements: the algorithm in charge of the transformation, the different parameters that are to be controlled by the user, the plugin wrapper and any other functions or resources required by it. Different audio effects can be chained in parallel and/or series to create more complex transformations. Sound effect objects create sounds and one or more audio effect objects then modify the sounds.

Scene—An auditory scene is the result of distributing different sound sources over time and space that have been processed to be contextualized for an specific listener and space.

FIG. 1 shows how the above modules may be arranged according to an embodiment in order to construct a scene for providing a sound effect.

Provided below is a description of the system components of the sound synthesis system according to embodiments.

From a systems perspective, the platform according to embodiments comprises sound effect objects that create and manipulate sounds and audio effect objects that apply further transformations to the sounds output from the sound effect objects. The framework is improved by a series of components that expand the creative use of these objects, allowing the user to create more elaborate sound effects and/or complete synthesized scenes, as well as to easily find the particular sounds they need. These components range from a dedicated fully-featured timeline for automating sounds and parameters, to a series of collaborative navigation tools that minimise the work it takes to find a base sound to start sculpting on.

Provided below is a description of the timeline of the sound synthesis system according to embodiments.

The timeline is used to manipulate all individual entities required for creation of a sound scene over time. Embodiments provide an interface, trigger track and control track of the timeline.

Interface—A continuous timeline, can be instantiated per synthesis track, mix and auxiliary bus. For synthesis tracks, each timeline object would have 2 distinct tracks. The Trigger track can be used for triggering the sound effect at specific times. The control tracks can be used to manipulation the parameters of the model over time to shape the sound effect and control how it evolves over time. On the other hand, timeline objects for bus tracks, would only have the latter. The granularity of the timelines is deemed as continuous (sample rate granularity). A ruler can be used to place entities at desired time intervals.

Trigger Track—The sound effect object can be triggered at desired times by marking those points on the timeline of the trigger track. For continuous sounds, a specific start point can be selected and dragged across the timeline to the desired end point. The track is used to trigger 3 distinct entities: The sound effect object with manually adjusted parameters, the generation of any settings (such as preset values of sound synthesis models) and the Randomiser (explained in more detail later). The Randomiser can be used to generate new experimental sounds or when triggering multiple instances of the same sound, applying a small percentage of randomisation can help create a more natural feel by ensuring each instance synthesised is slightly different from others.

Control Track—Sound effect model can have a control track for each parameter. These control tracks can be used to manipulate the behaviour of the sound effect model by adjusting the individual parameter's settings over time. Each parameter selected from a dropdown menu has its own associated track. At any given time, the selected parameter's track is the one show and called active.

Figure 2:
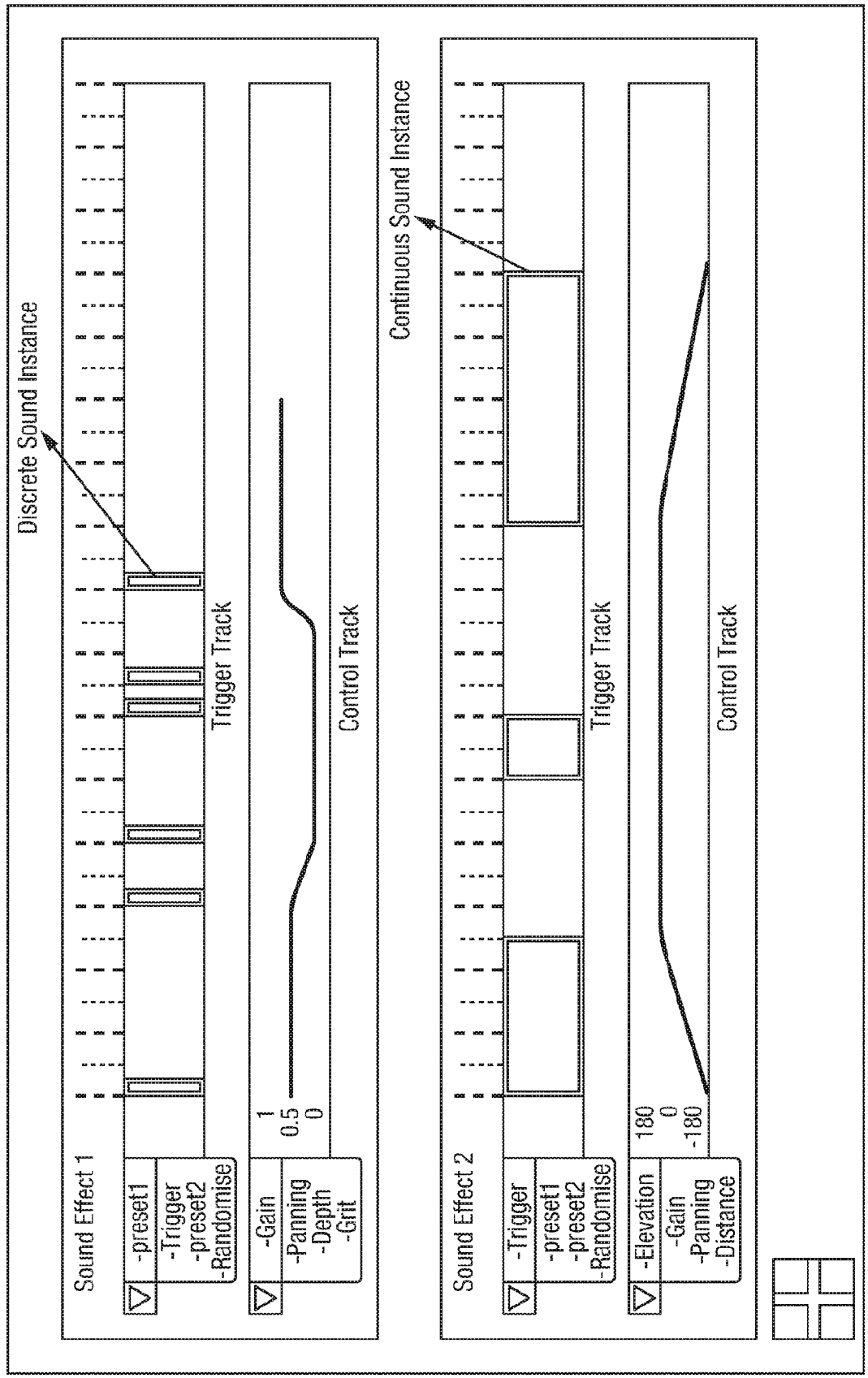
FIG. 2 shows timelines for two different sound effects according to an embodiment.

FIG. 2 shows an example of timelines with trigger tracks and control tracks for two different sound effects according to an embodiment.

Provided below is a description of spatialisation in the sound synthesis system according to embodiments. The spatialisation is performed by a scene creation function that receives sounds from sound effect objects and/or audio effect objects.

Spatial placement can be used to further sculpt sound effect and sound scenes. Panning is employed in order to spatialize sound sources on the horizontal plane as well as 3D spatialisation techniques. This allows for the location and movement of the sound effect sources and may be used as an additional and powerful sound design tool.

Spatial encoding is available in three different forms:
  The first of these forms refers to that spatial information that has already been encoded in some of the sound effect's algorithms. This aspect is mostly hidden to the user and only exposed through more abstract but semantically-meaningful control parameters.

Second of these techniques is achieved via a 3D Cartesian system available within the Web Audio API, on which orientation, distance and directionality can be configured for every source.

Further degrees of spatialisation are also offered through higher-order ambisonics using an external library (such as Google's Songbird) that allows the configuration and tuning of a specific room, listener and source model for more accurate representations.

Embodiments comprise the provision of audio rendering. Through the use of the Web Audio API tools and extended with third party open libraries, rendering of effects and soundscapes into different 2D and 3D audio formats is made possible in the system.

Mono and stereo formats are already supported, but also off-the-shelf upmixing to surround sound formats (i.e. quad and 5.1) is available.

The system also offers the possibility to perform real-time encoding of different order ambisonics that can then be encoded into a binaural stream via integration of Google's® Omnitone and Songbird technologies.

Provided below is a description of the navigation tools of the sound synthesis system according to embodiments. The navigation tools comprise taxonomy and folksonomy.

Taxonomy—Synthesis objects are organised via a 'taxonomy' based hierarchical categorization. Sound synthesis objects, and their associated effects chains are categorised within their parent sound classes. Temporal and spatial combinations of these sound synthesis models are combined to create sound effect synthesis scenes.

User Customisable Levels:
1. Sound Synthesis Objects:
    The ability to assign custom values to the exposed parameters of the sound synthesis objects
2. Sound Effect Chain:
    The ability to assign custom effects chain of post processing tools provided to a sound synthesis object.
3. Sound Scene:
    The ability to position a number of sound synthesis models along with the effects chains in temporal and spatial locations Folksonomy—The user base is provided with the ability to save and store their custom creations on the platforms server. A social tagging system where users are able to apply public tags to each level of this hierarchical system is employed which creates a social classification system for all custom user created content. Users are able to assign any number and combination of tags to describe content.
    The combination of the tagging system and the ability to publish the custom content as community accessible content allows for the finding and re-finding of content based on the creative needs of a user and an internal search functionality. The tags reflect the user's conceptual model which may differ from that of the original design. This allows users to share potentially useful sonic characteristics of sound synthesis objects and their combination. These include characteristics that they were not originally designed for and therefore not appropriately placed in the hierarchical system assigned by the developers.

Figure 3:
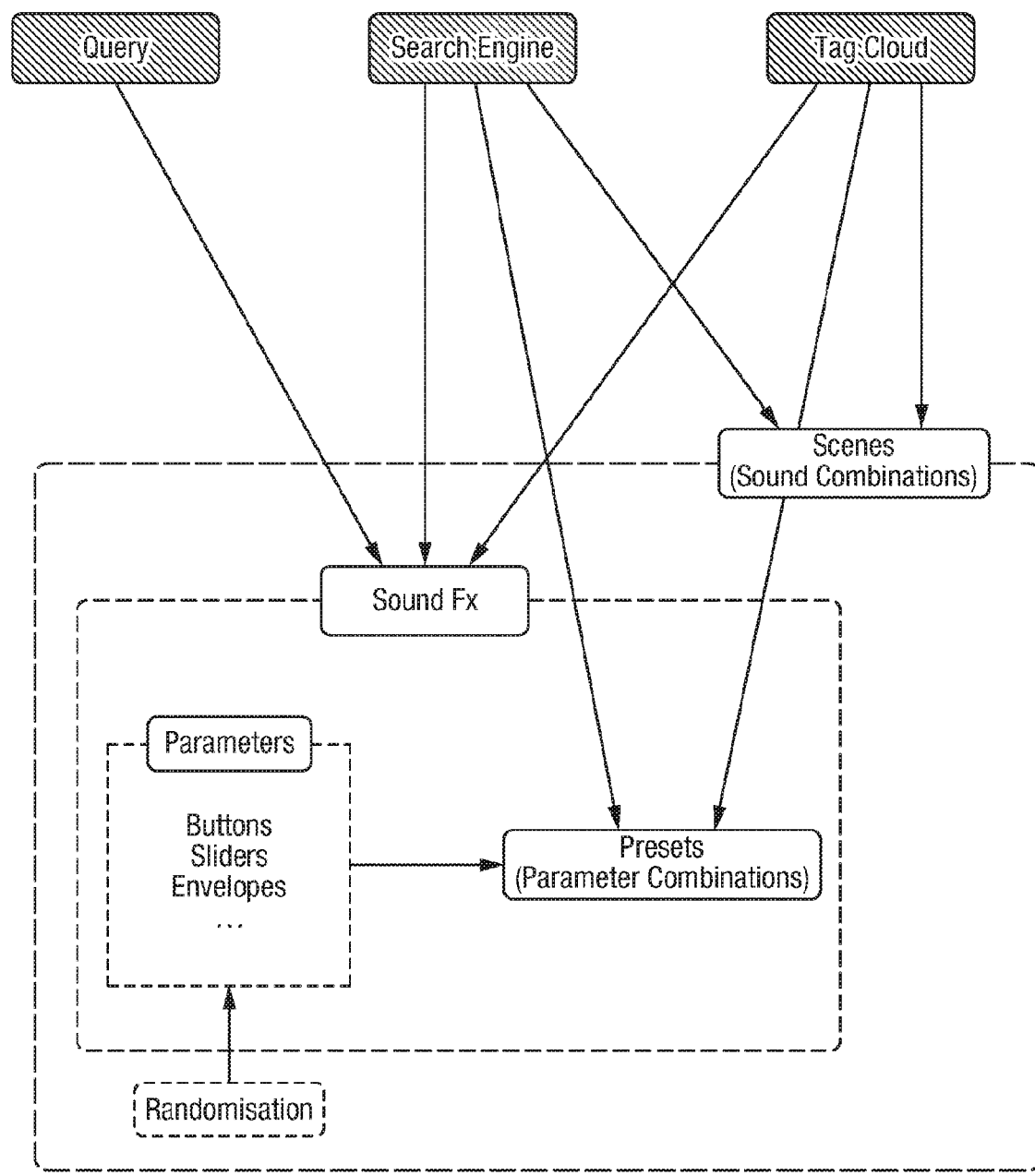
FIG. 3 shows an implementation of navigation tools according to an embodiment.

FIG. 3 shows an implementation of navigation tools according to an embodiment.

Provided below is a description of the audio routing in the sound synthesis system according to embodiments.

The audio post processing and element combination of sound synthesis objects are integral features within the platform. Both of these exercises may be described in the context of audio routing. This audio routing system is achieved through the employment of a modular system comprised of a combination of auxiliary channels and mix busses. Each audio conduit, is provided with native gain and panning control.

Synthesis Track—Synthesis tracks may be described as an audio channel containing a sound synthesis object as its audio source. Audio effect objects may be placed in series on the synthesis track.

Auxiliary Channel—An auxiliary channel acts as a split of the original signal and runs in parallel and in the same manner as the synthesis track is able to contain post processing modules. A further gain control is provided to set the amount of signal sent to an auxiliary channel, while the option of pre and post fader routing is given in order to isolate the auxiliary send from the audio source tracks native gain parameter.

Mix Bus—Mix busses are essentially an additional audio conduit with all the features found on a synthesis track, except that the audio source is determined by routing audio rather than by being directly connected to a sound synthesis object. Mix busses provide a location for multiple sources to be summed prior to being sent to the master output. This allows for common post processing of multiple audio sources.

Figure 4:
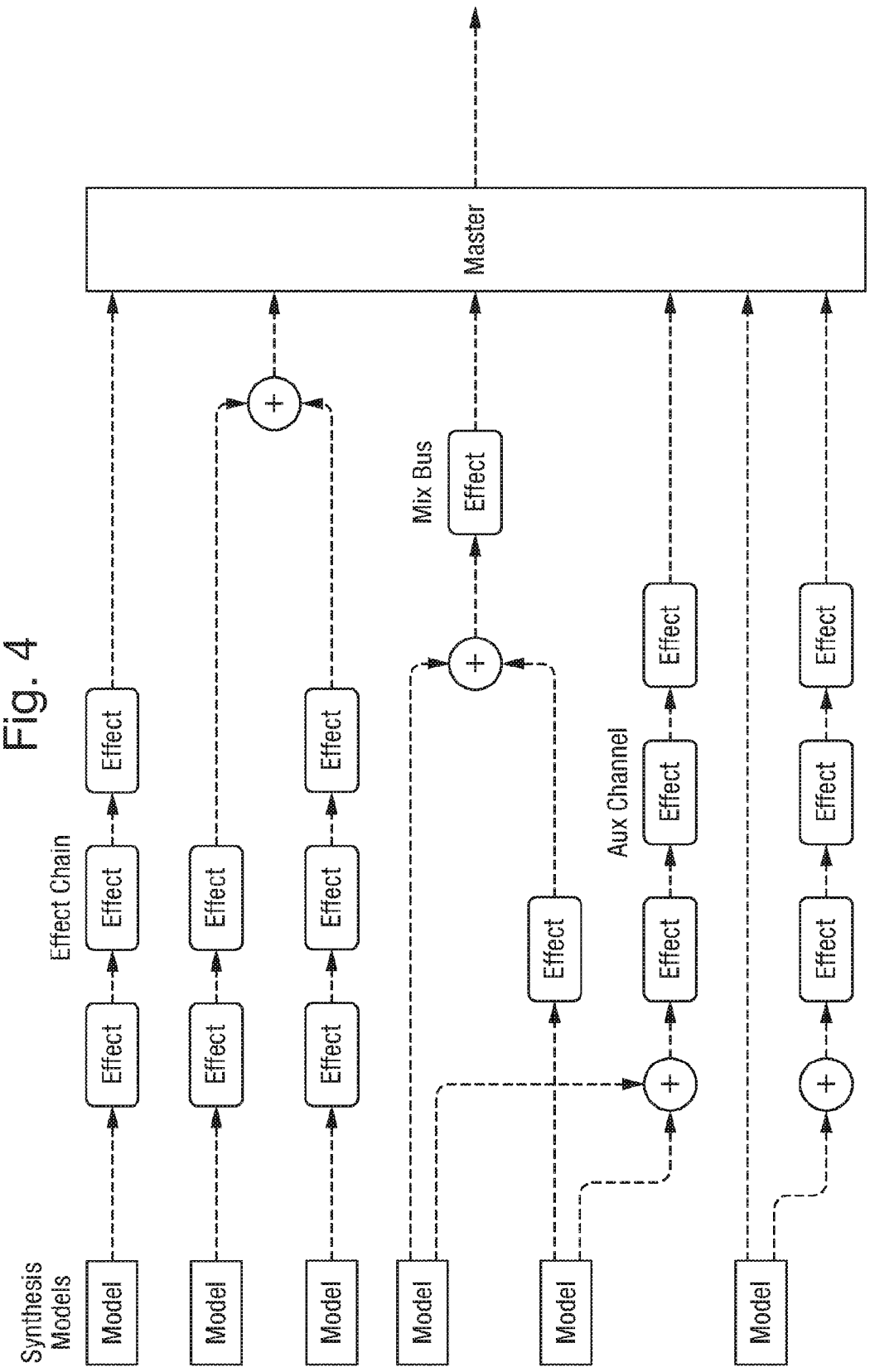
FIG. 4 shows an implementation of audio routing according to an embodiment.

FIG. 4 shows an implementation of audio routing according to an embodiment.

As shown in FIG. 4, the modular provision of audio effect objects that are separate from the sound synthesis objects allows flexible generation of each of the synthesised sounds that are sent to the master output. The number, and order, of audio effect objects that are applied to the output of a sound synthesis object is therefore easily adaptable. In particular, the outputs of sound synthesis objects and/or audio effect objects can be combined with each other so that a synthesised sound is generated in dependence on a plurality of different sound synthesis objects. The number of sound synthesis objects, and the order of audio effect objects, that a synthesised sound is generated in dependence on may be determined, and changed, by the audio routing function in dependence on user defined inputs.

Provided below is a description of the user interface of the sound synthesis system according to embodiments.

Each sound effect object has a bespoke interface designed to interact with the object for real-time synthesis. The interface comprises of several parameters which can be manipulated to generating new sounds by altering the synthesis process.

Functionality—Each sound effect object can be triggered to generate sound without using any of the control parameters of the interface. The models within the objects are designed and tuned in a way to generate a relevant sound to what they represent. There is however a large degree of flexibility with respect to the properties of the generated sound. Control parameters are available for each model which allow controlling certain properties of the sound by manipulating the synthesis process. By tuning these parameters, the synthesised sound can be altered in characteristics including length, amplitude, envelope shape, timbre, etc. The degree of variety changes for each model, depending on the synthesis algorithms. For some models this can mean achieving similar sounds with slight variation in timbre and for others it can mean a whole range of distinct and distinguished sounds.

Parameters—Every model is equipped with the same global parameters and a set of bespoke model parameters which directly control the synthesis process.

Global parameters include: trigger, gain, panning and Randomiser. The functionality of trigger (i.e. button pressed to generate the sound), gain and panning is implicit from these descriptive terms. The Randomiser is used to randomise the model parameters values. The parameters to randomise can be selected and the percentage of randomisation can be set. Each time the Randomiser is triggered, it will take into account the current value set for the parameter and will randomise it up to the specified percentage around the value.

The model parameters are described below.

Real-time Synthesis models use established signal processing entities and process them for obtaining the required sounds. These may include oscillators, envelopes, filters and a variety of synthesis techniques such as FM or AM modulation. Alteration of the synthesised sound would depend on changing the parameters used for these entities and processes. However, in order to provide parameters meaningful and relevant to the end user and to what the model is trying to generate, the exposed parameters are often different from these primary entities.

Each model is equipped with parameters which either describe a real-world characteristic of the sound being generated (e.g. density of rain, crackling of fire, wind speed, height, bubble frequency, duration, distance from listener) or a semantic descriptor commonly used for sound design (e.g. warmth, depth, woosh, rumble, ambience, gustiness, sounds like metal/plastic/cardboard). Low level parameters of the algorithm describing the synthesis model (e.g., filters and envelopes applied to noise sources, choice of frequency components to capture resonance of an object) are mapped to semantically meaningful descriptors which are exposed to the user. This empowers the user to think in terms of the sound they are trying to achieve and not in relation to the algorithms used to generate that sound.

Provided below is a description of the graphical user interface of the sound synthesis system according to embodiments.

A graphical user interface is designed with a variety of control objects for manipulating one or sometimes a combination of parameters. The objects used are mostly those used in a typical audio software which the user is already familiar with such as buttons, sliders and knobs. Multi-slider and two-dimensional sliders and envelopes are used to provide a meaningful translation of one or more parameters combined into one control object to help maintain the focus on one attribute of the sound being generated. Device orientation and motion tracking is also used to create more complex combinations of parameters with time and spatial attributes. This allows the use of eligible devices (e.g. a mobile phone) as the supposed sound source and synthesise the anticipated sound by moving it accordingly.

Provided below is a description of the interface binding of the sound synthesis system according to embodiments.

The modularity of the system according to embodiments is particularly advantageous due to the different integration aspects. Each plugin is a self-contained entity that exposes a series of parameters to the host.

The system provides a series of functions within the framework for automatic binding of any html gui elements to these parameters, assigning any necessary listeners and tracking the changes.

On loading of the plugins, the host will be scanned in search of any gui-like elements that are correctly labelled and assign a different range, values, transformation curves and functions that are necessary to manipulate the parameters. If no elements are found that can be automatically mapped to the plugin parameters, these functions will generate a complete static GUI for control.

This feature allows integration of the plugin chain into different frameworks with ease, handling all the aspects of the sound scene generation in a self-contained entity.

Figure 5:
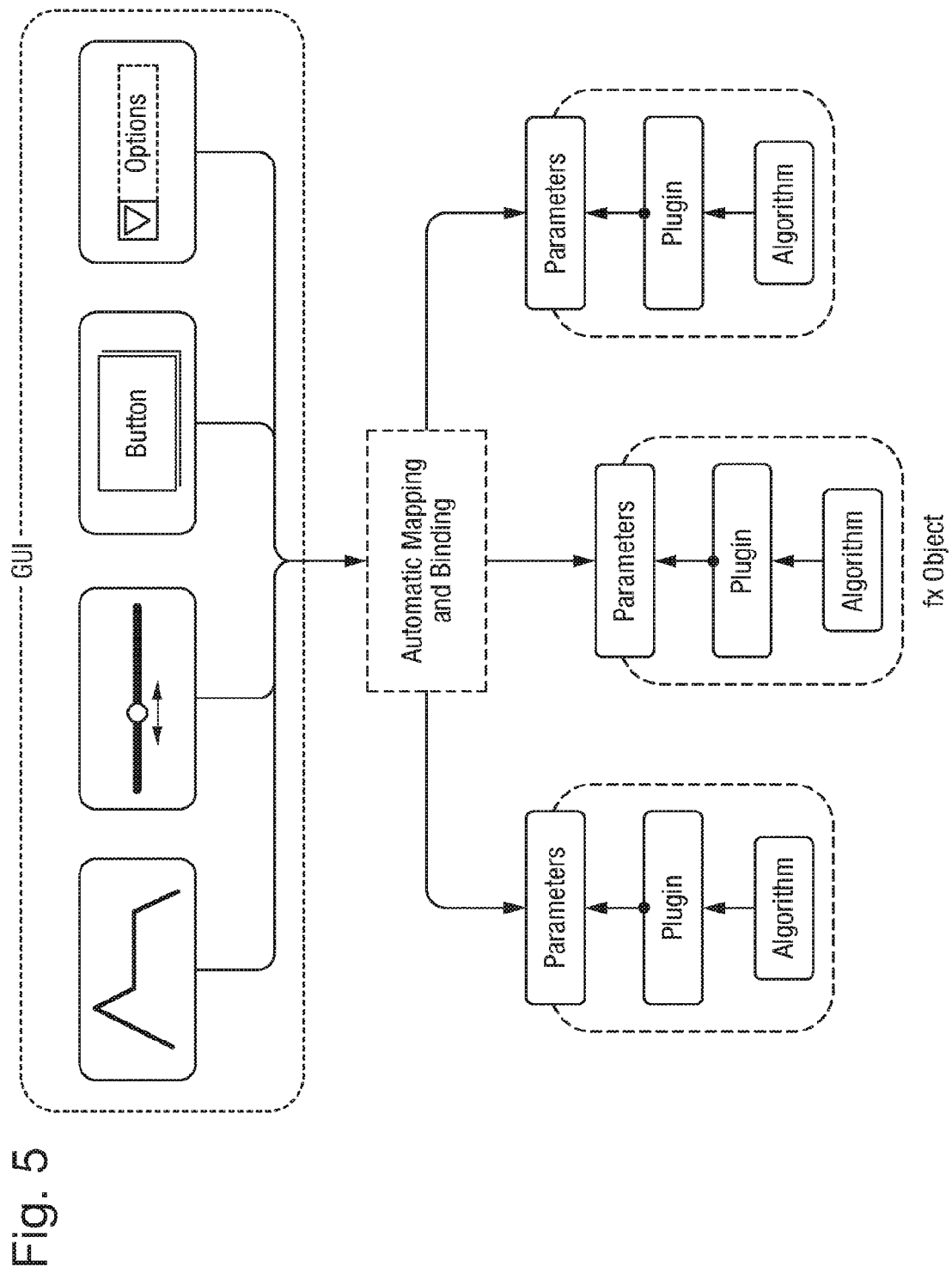
FIG. 5 shows interface binding according to an embodiment.

FIG. 5 shows interface binding according to an embodiment.

The sound synthesis system according to embodiments comprises sound synthesis models that give sound designers creative control over the sound effects. Each one of the sound synthesis models is based on a different class of sounds. The required number of sound synthesis models required for sound effect generation is a lot less than the required number of sound effect libraries for a similar sound effect generation capability. In addition, the flexible sound effect generation provided by embodiments allows improved functionality over known sound effect generation techniques with sound effect libraries.

Each of the sound effect objects according to embodiments is capable of synthesizing a range of sounds by filtering and shaping the amplitude envelope of sound sources and then applying a control on top of that which introduces timing aspects to the sound. For example, one sound effect object may generate all wind sounds, a different sound effect object may generate all rain sounds and a different sound effect object may generate all bird whistling sounds. Sound effects for a jungle scene may therefore be generated by combining sounds from all three of these sound effect objects. Similarly, a factory scene may be created by selecting sound effect objects for motors, engines, switches, phones and metal impact sounds.

The total number of sound synthesis models required to generate sound effects for substantially all applications is about a hundred.

Particularly advantageous aspects of embodiments include:

- The large number of sound synthesis models that can be easily combined and integrated in order to produce entire scenes and how this is presented in a common interface.
- Multiple sound classes can be synthesized from models with a common origin. That is to say, embodiments provide a generic framework for how to model all sound textures, another for all impact sounds, etc., and these frameworks are simply tweaked for more specific sounds.
- Audio effects are directly integrated into the sound synthesis, e.g., reverberation and spatial placement of the listener in respect to the generated sound.
- The modular nature of the sound synthesis system allows the system to be easily deployed and adapted.
- The sound synthesis system according to embodiments can operate in real time.
- The sound synthesis system according to embodiments can be provided online. A user who is remote from the sound synthesis system can therefore be provided with sound effects.

The sound synthesis system according to embodiments is fundamentally different from known music synthesisers intended for musical performance. Music synthesisers compose music by changing already created samples of music. The sound synthesis system according to embodiments is able to synthesise any sound, not just music, and generates a sound scene from scratch instead of requiring samples of music.

Embodiments include a number of modifications and variations of the techniques as described above.

For example, a way of navigating all of the synthesis models and sounds is through tagging and searching. However, a user can also browse classes that the synthesis models have been categorised into. The classes of models may include: Nature (rain, wind, thunder . . . ), Animals (bird whistles, roaring, howling . . . ), Weapons (guns, rocket launcher . . . ), Alarms/ringing (beeps, sirens, phones . . . ), Impacts (ricochet, bouncing, hammer on metal . . . ) and Machinery (motor, engine, fan . . . ) as well as other classes. A user may furthermore browse sound synthesis models through acoustic similarity, or by control mechanisms. Such aspects may be incorporated directly into the text describing presets for each model.

The flow charts and descriptions thereof herein should not be understood to prescribe a fixed order of performing the method steps described therein. Rather, the method steps may be performed in any order that is practicable. Although the present invention has been described in connection with specific exemplary embodiments, it should be understood that various changes, substitutions, and alterations apparent to those skilled in the art can be made to the disclosed embodiments without departing from the spirit and scope of the invention as set forth in the appended claims.

Methods and processes described herein can be embodied as code (e.g., software code) and/or data. Such code and data can be stored on one or more computer-readable media, which may include any device or medium that can store code and/or data for use by a computer system. When a computer system reads and executes the code and/or data stored on a computer-readable medium, the computer system performs the methods and processes embodied as data structures and code stored within the computer-readable storage medium. In certain embodiments, one or more of the steps of the methods and processes described herein can be performed by a processor (e.g., a processor of a computer system or data storage system). It should be appreciated by those skilled in the art that computer-readable media include removable and non-removable structures/devices that can be used for storage of information, such as computer-readable instructions, data structures, program modules, and other data used by a computing system/environment. A computer-readable medium includes, but is not limited to, volatile memory such as random access memories (RAM, DRAM, SRAM); and non-volatile memory such as flash memory, various read-only-memories (ROM, PROM, EPROM, EEPROM), magnetic and ferromagnetic/ferroelectric memories (MRAM, FeRAM), phase-change memory and magnetic and optical storage devices (hard drives, magnetic tape, CDs, DVDs); network devices; or other media now known or later developed that is capable of storing computer-readable information/data. Computer-readable media should not be construed or interpreted to include any propagating signals.

The invention claimed is:

1. A sound synthesis system for generating a user defined synthesized sound effect, the system comprising:
   a receiver of user defined inputs for defining a sound effect;
   a generator of control parameters in dependence on the received user defined inputs;
   a plurality of sound effect objects, wherein each sound effect object is arranged to generate a different class of sound and each sound effect object comprises a sound synthesis model arranged to generate a sound in dependence on one or more of the control parameters;
   a plurality of audio effect objects, wherein each audio effect object is arranged to receive a sound from one or more sound effect objects and one or more other audio effect objects, process the received sound in dependence on one or more of the control parameters and output the processed sound;
   a scene creation function arranged to receive sound output from one or more sound effect objects and audio effect objects and to generate a synthesized sound effect in dependence on the received sound; and
   an audio routing function arranged to determine the arrangement of audio effect objects, sound effect objects and scene creation function such that one or more sounds received by the scene creation function are dependent on the audio routing function;
   wherein the determined arrangement of audio effect objects, sound effect objects and the scene creation function by the audio routing function is dependent on the user defined inputs;
   wherein each sound synthesis model comprises an algorithm configured to generate a synthesized sound in dependence on one or more of the control parameters;
   wherein each of the audio effects object comprises an algorithm configured to process a received sound in dependence on one or more of the control parameters;
   wherein the sound synthesis system is arranged to operate substantially in real time;
   wherein the sound synthesis system further comprises a trigger track for defining start times and or end times on the timeline of each sound effect object and audio effect object;
   wherein the trigger track further comprises a randomizer arranged to cause random, or pseudo-random, variations of a sound;
   wherein a trigger track is provided for one or more synthesis track, auxiliary channel, sound effect, mix bus, sound effect object and audio effect object;
   wherein the sound synthesis system further comprises a control track for changing one or more of the control parameters over the timeline; and
   wherein a control track is provided for one or more synthesis track, auxiliary channel, sound effect, mix bus, sound effect object and audio effect object.

2. The sound synthesis system according to claim 1, further comprising an application interface, API, wherein:
   the user defined inputs are input to the sound synthesis system via the API; and
   the generated synthesized user defined sound effect is output from the sound synthesis system via the API.

3. The sound synthesis system according to claim 1, wherein the user defined inputs are received via the Internet.

4. The sound synthesis system according to claim 1, wherein each of the sound synthesis models comprises a plugin.

5. The sound synthesis system according to claim 1, wherein each of the audio effect objects comprises a plugin.

6. The sound synthesis system according to claim 1, wherein the sound effect object comprises a spatialization function for generating sound effects directed towards a position in a virtual space.

7. The sound synthesis system according to claim 1, wherein, for each sound generated by one or more of the sound effect objects, the audio routing function is arranged to determine the order in which a plurality of the audio effect objects process the sound; and the audio routing function is arranged to determine the number of sound effect objects that each sound received by the scene creation function is generated in dependence on;

wherein a plurality of the audio effect objects are arranged in series with other so that a sound is sequentially processed by each of the audio effect objects; and wherein a plurality of the audio effect objects are arranged in parallel with other so that the parallel audio effect objects receive and process the same sound;

wherein the audio routing function comprises:

one or more synthesis tracks that comprise one or more audio effect objects in series with a sound effect object; and one or more auxiliary channels, wherein each auxiliary channel is split from a synthesis track and comprises one or more audio effect objects; and one or more mix busses for combining received sounds from one or more synthesis tracks and one or more auxiliary channels;

wherein each synthesis track, auxiliary channel and mix bus comprises gain and panning controls;

wherein the scene creation function generates the synthesized sound effect in dependence time data for each of the sound effect objects;

wherein the sound synthesis system further comprises one or more timelines, wherein the time data for each of the sound effect objects is determined in dependence on the one or more timelines; and wherein a timeline is defined for each synthesis track, auxiliary channel and mix bus.

8. The sound synthesis system according to claim 1, further comprising a graphical user interface for receiving inputs user defined inputs;

wherein at least some of the sound effect objects and audio effect objects comprise graphical user interface elements;

the graphical user interface is arranged to be automatically generated in dependence on the graphical user interface elements;

wherein the graphical user interface elements are dependent on one or more of the controllable parameters of the sound effect objects and audio effect objects;

wherein the graphical user interface displays one or more timelines that display properties of one or more sound effect objects and audio effect objects; and wherein the user defined inputs are generated by a user modifying the displayed properties on the timeline.

9. The sound synthesis system according to claim 1, wherein the control parameters comprise global parameters that are the same for each sound effect object and audio effect object in a synthesis track and auxiliary channel for a sound effect.

10. The sound synthesis system according to claim 1, wherein the control parameters comprise object specific parameters that are the same or different for each sound effect object and audio effect object in a synthesis track and auxiliary channel for a sound effect.

11. The sound synthesis system according to claim 1, wherein the user defined inputs are user intuitive inputs; and the generator of the control parameters is arranged to map the user defined inputs to the control parameters.

12. The sound synthesis system according to claim 1, wherein the user defined inputs include real-world characteristics of a sound effect and semantic descriptors, such as any of density of rain, crackling of fire, wind speed, height, bubble frequency, duration, distance from listener, roughness of ground, warmth, depth, woosh, rumble, ambience, gustiness and sounds like metal/plastic/cardboard.

13. The sound synthesis system according to claim 1, wherein the sound synthesis system is computer-implemented;

wherein the sound effect object, audio effect object and scene creation function are all software modules.

14. The sound synthesis system according to claim 1, wherein the number of different classes of sound that can be generated by sound effect objects is 100; wherein classes of sound include nature, animals, weapons, alarms/ringing, impacts and machinery.

15. The sound synthesis system according to claim 1, wherein the algorithm comprised by each sound synthesis model is configured to generate a synthesized sound in dependence on the manipulation, processing and combining of noise sources, impulses and oscillators.

16. A method of synthesizing a user defined synthesized sound effect, the method comprising:

inputting a definition of a sound effect into a sound synthesis system; and receiving a sound effect from the sound synthesis system;

wherein the sound synthesis system is for generating a user defined synthesized sound effect and comprises:

a receiver of user defined inputs for defining a sound effect;

a generator of control parameters in dependence on the received user defined inputs;

a plurality of sound effect objects, wherein each sound effect object is arranged to generate a different class of sound and each sound effect object comprises a sound synthesis model arranged to generate a sound in dependence on one or more of the control parameters;

a plurality of audio effect objects, wherein each audio effect object is arranged to receive a sound from one or more sound effect objects and one or more other audio effect objects, process the received sound in dependence on one or more of the control parameters and output the processed sound;

a scene creation function arranged to receive sound output from one or more sound effect objects and audio effect objects and to generate a synthesized sound effect in dependence on the received sound; and an audio routing function arranged to determine the arrangement of audio effect objects, sound effect objects and scene creation function such that one or more sounds received by the scene creation function are dependent on the audio routing function;

wherein the determined arrangement of audio effect objects, sound effect objects and the scene creation function by the audio routing function is dependent on the user defined inputs;

wherein each sound synthesis model comprises an algorithm configured to generate a synthesized sound in dependence on one or more of the control parameters;

wherein each of the audio effect objects comprises an algorithm configured to process a received sound in dependence on one or more of the control parameters;

wherein the sound synthesis method operates substantially in real time;

wherein the sound synthesis system further comprises a trigger track for defining start times and or end times on the timeline of each sound effect object and audio effect object;

wherein the trigger track further comprises a randomizer arranged to cause random, or pseudo-random, variations of a sound;

wherein a trigger track is provided for one or more synthesis track, auxiliary channel, sound effect, mix bus, sound effect object and audio effect object;

wherein the sound synthesis system further comprises a control track for changing one or more of the control parameters over the timeline; and wherein a control track is provided for one or more synthesis track, auxiliary channel, sound effect, mix bus, sound effect object and audio effect object.

17. The method of synthesizing a user defined synthesized sound effect according to claim 16, wherein the algorithm comprised by each sound synthesis model is configured to generate a synthesized sound in dependence on the manipulation, processing and combining of noise sources, impulses and oscillators.

18. A non-transitory computer readable medium comprising computer program, the computer program comprising instructions that, when executed, provide a method of synthesizing a user defined synthesized sound effect, the method comprising:

inputting a definition of a sound effect into a sound synthesis system; and receiving a sound effect from the sound synthesis system;

wherein the sound synthesis system is for generating a user defined synthesized sound effect and comprises:

a receiver of user defined inputs for defining a sound effect;

a generator of control parameters in dependence on the received user defined inputs;

a plurality of sound effect objects, wherein each sound effect object is arranged to generate a different class of sound and each sound effect object comprises a sound synthesis model arranged to generate a sound in dependence on one or more of the control parameters;

a plurality of audio effect objects, wherein each audio effect object is arranged to receive a sound from one or more sound effect objects and one or more other audio effect objects, process the received sound in dependence on one or more of the control parameters and output the processed sound;

a scene creation function arranged to receive sound output from one or more sound effect objects and audio effect objects and to generate a synthesized sound effect in dependence on the received sound; and an audio routing function arranged to determine the arrangement of audio effect objects, sound effect objects and scene creation function such that one or more sounds received by the scene creation function are dependent on the audio routing function;

wherein the determined arrangement of audio effect objects, sound effect objects and the scene creation function by the audio routing function is dependent on the user defined inputs;

wherein each sound synthesis model comprises an algorithm configured to generate a synthesized sound in dependence on one or more of the control parameters;

wherein each of the audio effect object comprises an algorithm configured to process a received sound in dependence on one or more of the control parameters;

wherein the provided method of synthesizing a user defined synthesized sound effect operates substantially in real time, wherein the sound synthesis system further comprises a trigger track for defining start times and or end times on the timeline of each sound effect object and audio effect object;

wherein the trigger track further comprises a randomizer arranged to cause random, or pseudo-random, variations of a sound;

wherein a trigger track is provided for one or more synthesis track, auxiliary channel, sound effect, mix bus, sound effect object and audio effect object;

wherein the sound synthesis system further comprises a control track for changing one or more of the control parameters over the timeline; and wherein a control track is provided for one or more synthesis track, auxiliary channel, sound effect, mix bus, sound effect object and audio effect object.

19. The non-transitory computer readable medium (program) according to claim 18, wherein the algorithm comprised by each sound synthesis model is configured to generate a synthesized sound in dependence on the manipulation, processing and combining of noise sources, impulses and oscillators.

* * * * *